US012700147B2

(12) United States Patent
Chu

(10) Patent No.: US 12,700,147 B2
(45) Date of Patent: *Aug. 4, 2026

(54) PATTERN MATCHING TOOL

(71) Applicant: Procore Technologies, Inc.,
Carpinteria, CA (US)

(72) Inventor: Winson Chu, Alameda, CA (US)

(73) Assignee: Procore Technologies, Inc.,
Carpinteria, CA (US)

( * ) Notice: Subject to any disclaimer, the term of this
patent is extended or adjusted under 35
U.S.C. 154(b) by 58 days.

This patent is subject to a terminal disclaimer.

(21) Appl. No.: 18/809,253

(22) Filed: Aug. 19, 2024

(65) Prior Publication Data

US 2024/0412422 A1 Dec. 12, 2024

Related U.S. Application Data

(63) Continuation of application No. 18/317,508, filed on
May 15, 2023, now Pat. No. 12,067,648, which is a
(Continued)

(51) Int. Cl.
*G06T 11/00* (2026.01)
*G06F 16/21* (2019.01)
(Continued)

(52) U.S. Cl.
CPC ............ *G06T 11/00* (2013.01); *G06F 16/212*
(2019.01); *G06F 30/13* (2020.01); *G06T 3/40*
(2013.01);
(Continued)

(58) Field of Classification Search
USPC ....................................................... 345/649
See application file for complete search history.

(56) References Cited

U.S. PATENT DOCUMENTS

2001/0032923 A1 10/2001 Koashi
2004/0032415 A1 2/2004 Rimas et al.
(Continued)

FOREIGN PATENT DOCUMENTS

KR 10-2016-0093506 A 8/2016

OTHER PUBLICATIONS

Stack Overflow, "Find Intersection Point of Two Lines Drawn Using
Houghlines Opencv", https://stackoverflow.com/questions/46565975/
find-intersection-point-of-two-lines-drawn-using-houghlines-opencv?
rq=1, retrieved from the Internet Jan. 29, 2020, 10 pages.
(Continued)

*Primary Examiner* — James A Thompson
*Assistant Examiner* — Kim Thanh T Tran
(74) *Attorney, Agent, or Firm* — Lee Sullivan Shea &
Smith LLP

(57) ABSTRACT

A pattern attaching technique involves (1) obtaining a first
collection of data libraries associated with a first set of
intersection points among a first set of lines in a first
two-dimensional (2D) drawing and a second collection of
data libraries associated with a second set of intersection
points among a second set of lines in a second 2D drawing
and (2) comparing the first collection of data libraries and
the second collection of data libraries in order to determine
whether the first 2D drawing and the second 2D drawing
represent a same portion of a real-world environment. Each
data library associated with a given set of intersection points
includes location information that describes a respective
location of each respective intersection point in the given set
of intersection points relative to each other intersection point
in the given set of intersection points.

20 Claims, 9 Drawing Sheets
(2 of 9 Drawing Sheet(s) Filed in Color)

Related U.S. Application Data continuation of application No. 17/699,535, filed on Mar. 21, 2022, now Pat. No. 11,651,524, which is a continuation of application No. 17/138,171, filed on Dec. 30, 2020, now Pat. No. 11,282,217, which is a continuation of application No. 16/402,971, filed on May 3, 2019, now Pat. No. 10,909,698.

(51) Int. Cl.

| | | |
|---|---|---|
| *G06F 30/13* | (2020.01) | |
| *G06T 3/40* | (2024.01) | |
| *G06T 3/60* | (2024.01) | |
| *G06T 7/33* | (2017.01) | |
| *G06V 10/44* | (2022.01) | |
| *G06V 10/75* | (2022.01) | |
| *G06V 30/422* | (2022.01) | |

(52) U.S. Cl.
CPC ................. *G06T 3/60* (2013.01); *G06T 7/33* (2017.01); *G06V 10/44* (2022.01); *G06V 10/757* (2022.01); *G06V 30/422* (2022.01)

(56) References Cited

U.S. PATENT DOCUMENTS

| | | | | |
|---|---|---|---|---|
| 2004/0145614 A1* | 7/2004 | Takagaki | ............... | G06F 30/13 |
| | | | | 345/420 |
| 2009/0043504 A1* | 2/2009 | Bandyopadhyay | ..... | G01S 19/49 |
| | | | | 701/469 |
| 2010/0076959 A1 | 3/2010 | Ramani et al. | | |
| 2010/0092072 A1 | 4/2010 | Guntur | | |
| 2012/0155745 A1 | 6/2012 | Park et al. | | |
| 2014/0156049 A1 | 6/2014 | Walker, Jr. | | |
| 2014/0237035 A1 | 8/2014 | Smith et al. | | |
| 2018/0077383 A1 | 3/2018 | Akao et al. | | |
| 2018/0196574 A1 | 7/2018 | Case, Jr. et al. | | |

OTHER PUBLICATIONS

OpenCV, "cv::LineSegmentDetector Class Reference", https://docs.opencv.org/3.2.0/db/d73/classcv_1_1LineSegmentDetector.html, retrieved from the Internet Jan. 28, 2020, 4 pages.

Stack Overflow, "How to Detect Lines in OpenCV", https://stackoverflow.com/questions/45322630/how-to-detect-lines-in-opencv/45481619#45481619, retrieved from the Internet Jan. 29, 2020, 12 pages.

GitHub, "Repository for OpenCV's Extra Modules", https://github.com/opencv/opencv_contrib, retrieved from the Internet Jan. 28, 2020, 2 pages.

OpenCV, "How to Build Applications with OpenCV Inside the Microsoft Visual Studio", https://docs.opencv.org/4.0.1/dd/d6e/tutorial_windows_visual_studio_opencv.html, retrieved from the Internet Jan. 29, 2020, 5 pages.

OpenCV, "Installation in Windows", https://docs.opencv.org/4.0.1/d3/d52/tutorial_windows_install.html, retrieved from the Internet Jan. 29, 2020, 7 pages.

Stack Overflow, "How Can I Install/Configure OpenCV3.2.0 with C++, Visual Studio 2017?", https://stackoverflow.com/questions/43786856/how-can-i-install-configure-opencv3-2-0-with-c-visual-studio-2017, retrieved from the Internet Jan. 29, 2020, 8 pages.

International Searching Authority, International Search Report and Written Opinion, PCT/US2020/031081, mailed Aug. 20, 2020, 9 pages.

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

* cited by examiner

300

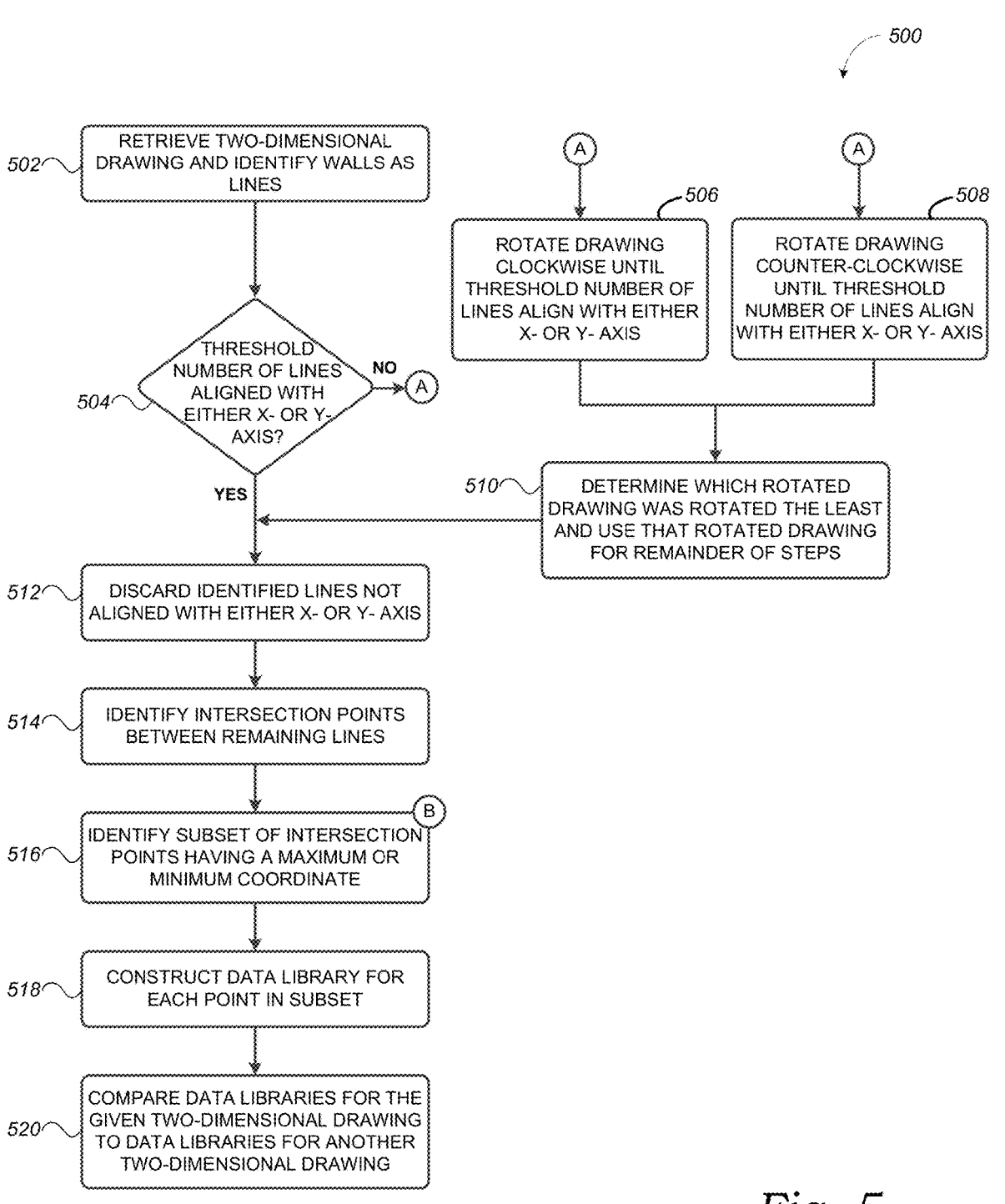

*500*

502 — RETRIEVE TWO-DIMENSIONAL DRAWING AND IDENTIFY WALLS AS LINES

504 — THRESHOLD NUMBER OF LINES ALIGNED WITH EITHER X- OR Y- AXIS?

NO → Ⓐ

YES

Ⓐ

506 — ROTATE DRAWING CLOCKWISE UNTIL THRESHOLD NUMBER OF LINES ALIGN WITH EITHER X- OR Y- AXIS

Ⓐ

508 — ROTATE DRAWING COUNTER-CLOCKWISE UNTIL THRESHOLD NUMBER OF LINES ALIGN WITH EITHER X- OR Y- AXIS

510 — DETERMINE WHICH ROTATED DRAWING WAS ROTATED THE LEAST AND USE THAT ROTATED DRAWING FOR REMAINDER OF STEPS

512 — DISCARD IDENTIFIED LINES NOT ALIGNED WITH EITHER X- OR Y- AXIS

514 — IDENTIFY INTERSECTION POINTS BETWEEN REMAINING LINES

516 — IDENTIFY SUBSET OF INTERSECTION POINTS HAVING A MAXIMUM OR MINIMUM COORDINATE

Ⓑ

518 — CONSTRUCT DATA LIBRARY FOR EACH POINT IN SUBSET

520 — COMPARE DATA LIBRARIES FOR THE GIVEN TWO-DIMENSIONAL DRAWING TO DATA LIBRARIES FOR ANOTHER TWO-DIMENSIONAL DRAWING

*Fig. 5*

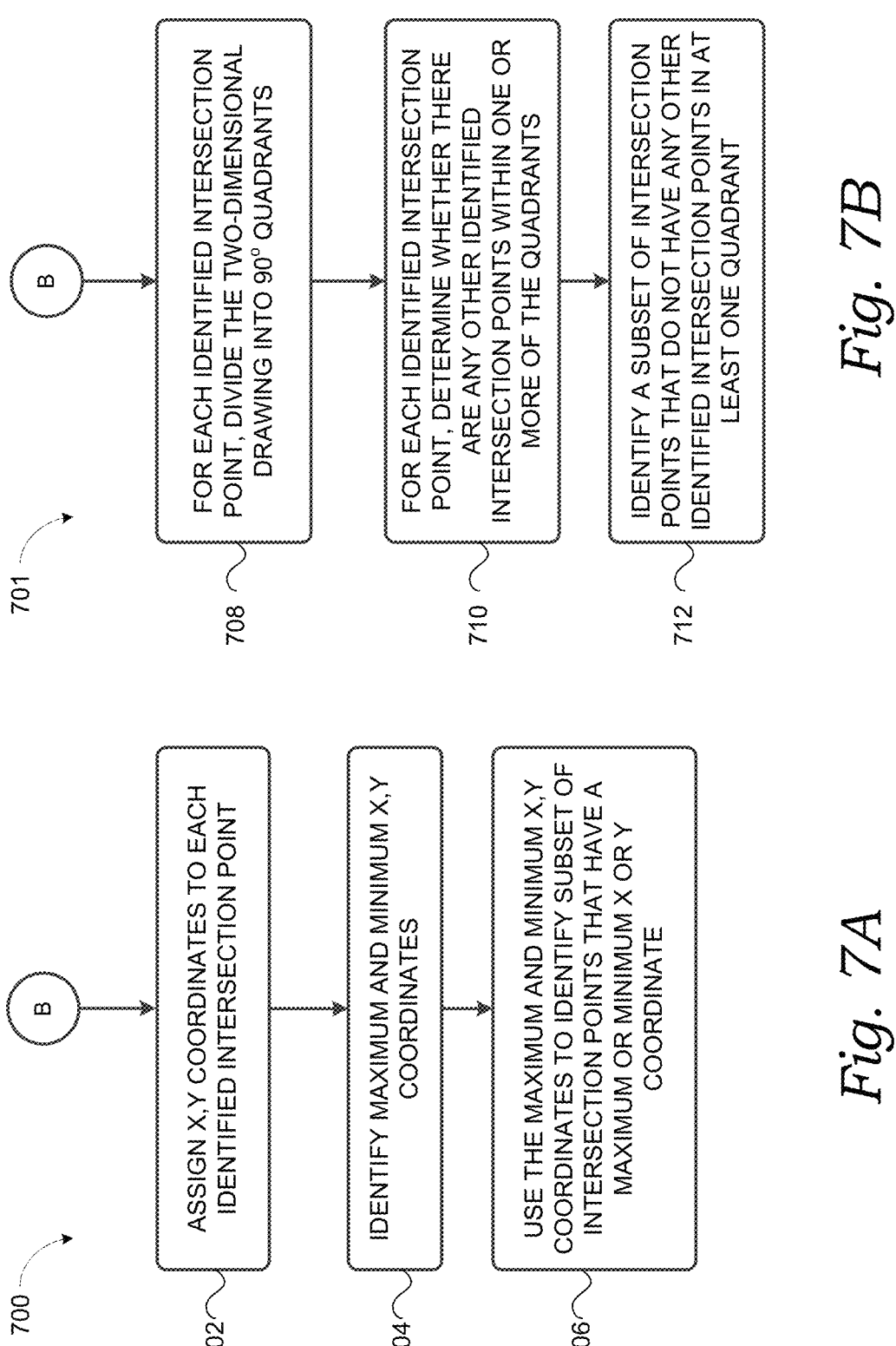

701

708 FOR EACH IDENTIFIED INTERSECTION POINT, DIVIDE THE TWO-DIMENSIONAL DRAWING INTO 90° QUADRANTS

710 FOR EACH IDENTIFIED INTERSECTION POINT, DETERMINE WHETHER THERE ARE ANY OTHER IDENTIFIED INTERSECTION POINTS WITHIN ONE OR MORE OF THE QUADRANTS

712 IDENTIFY A SUBSET OF INTERSECTION POINTS THAT DO NOT HAVE ANY OTHER IDENTIFIED INTERSECTION POINTS IN AT LEAST ONE QUADRANT

702 ASSIGN X,Y COORDINATES TO EACH IDENTIFIED INTERSECTION POINT

704 IDENTIFY MAXIMUM AND MINIMUM X,Y COORDINATES

706 USE THE MAXIMUM AND MINIMUM X,Y COORDINATES TO IDENTIFY SUBSET OF INTERSECTION POINTS THAT HAVE A MAXIMUM OR MINIMUM X OR Y COORDINATE

*Fig. 7A*

PATTERN MATCHING TOOL

CROSS-REFERENCE TO RELATED APPLICATION

This application is a continuation of U.S. Nonprovisional application Ser. No. 18/317,508 filed on May 15, 2023, and titled "Pattern Matching Tool," which is a continuation of U.S. Nonprovisional application Ser. No. 17/699,535 filed on Mar. 21, 2022, issued as U.S. Pat. No. 11,651,524, and titled "Pattern Matching Tool," which is a continuation of U.S. Nonprovisional application Ser. No. 17/138,171 filed on Dec. 30, 2020, issued as U.S. Pat. No. 11,282,217, and titled "Pattern Matching Tool," which is a continuation of U.S. Nonprovisional application Ser. No. 16/402,971 filed on May 3, 2019, issued as U.S. Pat. No. 10,909,698, and titled "Pattern Matching Tool," the contents of each of which are incorporated by reference herein in their entirety.

BACKGROUND

Construction projects are often complex endeavors involving the coordination of many professionals across several discrete phases. Typically, a construction project commences with a design phase, where architects design the overall shape and layout of a construction project, such as a building. Next, engineers engage in a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may engage in a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

Overview

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.).

Two-dimensional technical drawings have advantages. For instance, they are often set out in a universally-recognized format that most, if not all, construction professionals can read and understand. Further, they are designed to be relatively compact, with one drawing being arranged to fit on a single piece of paper or in a computerized file format that requires minimal processing power and computer storage (e.g., a PDF viewer, JPEG viewer, etc.). Yet, two-dimensional drawings have disadvantages as well. For instance, it often takes multiple drawings in order to visually communicate an overview of an entire construction project. This is due to the fact that two-dimensional drawings tend not to efficiently present information about the construction project from a third (e.g., vertical) dimension. Typically, a construction project may have at least one two-dimensional technical drawing per floor of the construction project. Thus, for a construction project spanning, say, ten floors, the construction project will have at least ten two-dimensional technical drawings, and perhaps more to fully visually communicate the various aspects of the construction project.

To advance over two-dimensional technical drawings, computerized, three-dimensional technology was developed as another form in which information about a construction project can be visually communicated. In this respect, a three-dimensional model of the construction project would be embodied in a computerized form, such as in a building information model (BIM) file, with three-dimensional meshes visually representing the physical elements of the construction project (e.g., walls, ducts, etc.). Specialized software is configured to access a BIM file and, based on this BIM file, render a three-dimensional view of the construction project from one or more perspectives. This provided some advantages over two-dimensional technical drawings, namely that a construction professional could often get a full overview of the entire construction project based on a single three-dimensional view and thus may not have to shuffle through multiple two-dimensional drawings in order to conceptualize what the construction project looks like. In addition, the specialized software allowed a construction professional to navigate throughout the three-dimensional view and focus on elements of interest in the construction project, such as a particular wall or duct.

Some BIM viewer technology provides the capability to generate a top-down two-dimensional drawing of a portion of a construction based on a particular three-dimensional view of that portion of the construction project. This top-down two-dimensional drawing may then be compared to a traditional two-dimensional technical drawing, such as a PDF construction plan or blueprint, in order to assess whether the construction plan or blueprint depicts or describes the same portion of the construction project being displayed by the 3D BIM viewer.

However, depending on the implementation, this comparison between the generated top-down two-dimensional drawing and the retrieved two-dimensional technical drawing may be a slow cumbersome process or may fail altogether, which results in a poor user experience. For instance, in some cases, one or both of the two-dimensional technical drawings under comparison may have hundreds, if not thousands, of lines. This may require an overwhelming number of computing resources to resolve, making comparison using traditional computer vision and pattern matching techniques a slow process. In other cases, one of the two-dimensional technical drawings may be at a different size or scale than the other two-dimensional technical drawing, which may also result in a slow process as well.

To address these problems (among others) with existing technology for comparing two two-dimensional drawings, disclosed herein is new software technology for comparing and matching two two-dimensional technical drawings. For instance, in one respect, disclosed herein is a software tool that engages in a pattern matching technique, which in some examples, may be used to determine whether two (or more) two-dimensional technical drawings depict the same portion of a construction project, such as the same floor of a building. Advantageously, the disclosed pattern matching technique may make this determination even if the two (or more) two-dimensional technical drawings are of different scales.

In one implementation, the disclosed software technology may cause a computing device to engage in the following operations: (1) retrieve a first two-dimensional drawing and identify walls depicted on the first two-dimensional drawing as lines; (ii) determine whether there at least a threshold number of lines are aligned with either the X or Y axes; (iii) if there are not at least a threshold number of lines aligned with either the X or Y axes, then (a) rotate the first two-dimensional drawing clockwise until a threshold number of lines align with either the X or Y axis, (b) rotate the first two-dimensional drawing counter-clockwise until a threshold number of lines align with either the X or Y axis, and (c) determine which rotation (i.e., the clockwise rotation or the counter-clockwise rotation) yielded the least amount of rotation before at least the threshold number of lines were aligned with either the X or Y axes, and use this rotation for the remainder of the steps; (iv) discard identified lines that are not aligned with either the X or Y axis; (vi) identify intersection points between the remaining lines; (vii) identify a subset of intersection points that have a maxima or minima coordinate; (viii) for each respective point in the identified subset, construct a data library indicative of the relative positions of the points in the identified subset relative to the given point; and (ix) compare the constructed data libraries for the first two-dimensional drawing to data libraries constructed for another two-dimensional drawing to draw a conclusion as to whether the first two-dimensional drawing and the other two-dimensional drawing depict the same portion of a construction project.

As set forth in more detail below, the disclosed software technology for matching two two-dimensional drawings may cause the computing system to engage in various other operations as well.

Accordingly, in one aspect, disclosed herein is a computer-implemented method that involves (i) retrieving a first two-dimensional drawing representative of a portion of a construction project, (ii) identifying lines on the two-dimensional drawing and points of intersection between two or more identified lines, (iii) from among the identified points of intersection between two or more lines, identifying a subset of the points of intersection in which each point of intersection in the identified subset has either a maximum or minimum coordinate within the first two-dimensional drawing, (iv) constructing a respective data library for each respective point of intersection in the identified subset, the respective data library comprising respective data mappings describing the relative orientation and distance to the respective point of intersection from each other point of intersection in the identified subset, and (v) comparing the data libraries constructed for the identified subset of points of intersection for the first two-dimensional drawing to data libraries constructed for a second two-dimensional drawing to thereby determine whether the first two-dimensional drawing and the second two-dimensional drawing depict the same portion of the construction project.

In another aspect, disclosed herein is a computing system that comprises at least one processor, a non-transitory computer-readable medium, and program instructions stored on the non-transitory computer-readable medium that are executable by the at least one processor to cause the computing system to carry out the operations disclosed herein, including but not limited to the operations of the foregoing method.

In yet another aspect, disclosed herein is a non-transitory computer-readable medium comprising program instructions that are executable to cause a computing system to carry out the operations disclosed herein, including but not limited to the operations of the foregoing method.

Further yet, in another aspect, disclosed herein is a method carried out by a computing device that involves (i) identifying a first set of lines in a first two-dimensional drawing that are aligned to at least a threshold extent with either an x-axis or a y-axis of the first two-dimensional drawing; (ii) determining, from the first set of lines, a set of intersection points that are located at outer edges of the first two-dimensional drawing; (iii) for each intersection point in the identified set, constructing a respective data library that includes angle information and coordinate value information for the respective intersection point relative to each other intersection point in the identified set; (iv) comparing at least a portion of a first collection of data libraries for the first two-dimensional drawing to a corresponding portion of a second collection of data libraries for a second two-dimensional drawing; and (v) based on the comparing, determining that the first two-dimensional drawing and the second two-dimensional drawing depict a same representation.

In another aspect, disclosed herein is a computing device that comprises at least one processor, a non-transitory computer-readable medium, and program instructions stored on the non-transitory computer-readable medium that are executable by the at least one processor to cause the computing device to carry out the operations disclosed herein, including but not limited to the operations of the foregoing methods.

In yet another aspect, disclosed herein is a non-transitory computer-readable medium that is provisioned with program instructions that, when executed by one or more processors, cause a computing device to carry out the operations disclosed herein, including but not limited to the operations of the foregoing methods.

One of ordinary skill in the art will appreciate these as well as numerous other aspects in reading the following disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 5 is a flow diagram depicting example operations for matching two two-dimensional drawings, according to one embodiment of the present disclosure.

FIG. 7A is a flow diagram depicting example operations for identifying intersection points having a maximum or minimum coordinate, according to one embodiment of the present disclosure.

FIG. 7B is a flow diagram depicting example operations for identifying intersection points having a maximum or minimum coordinate, according to one embodiment of the present disclosure.

Figure 1:
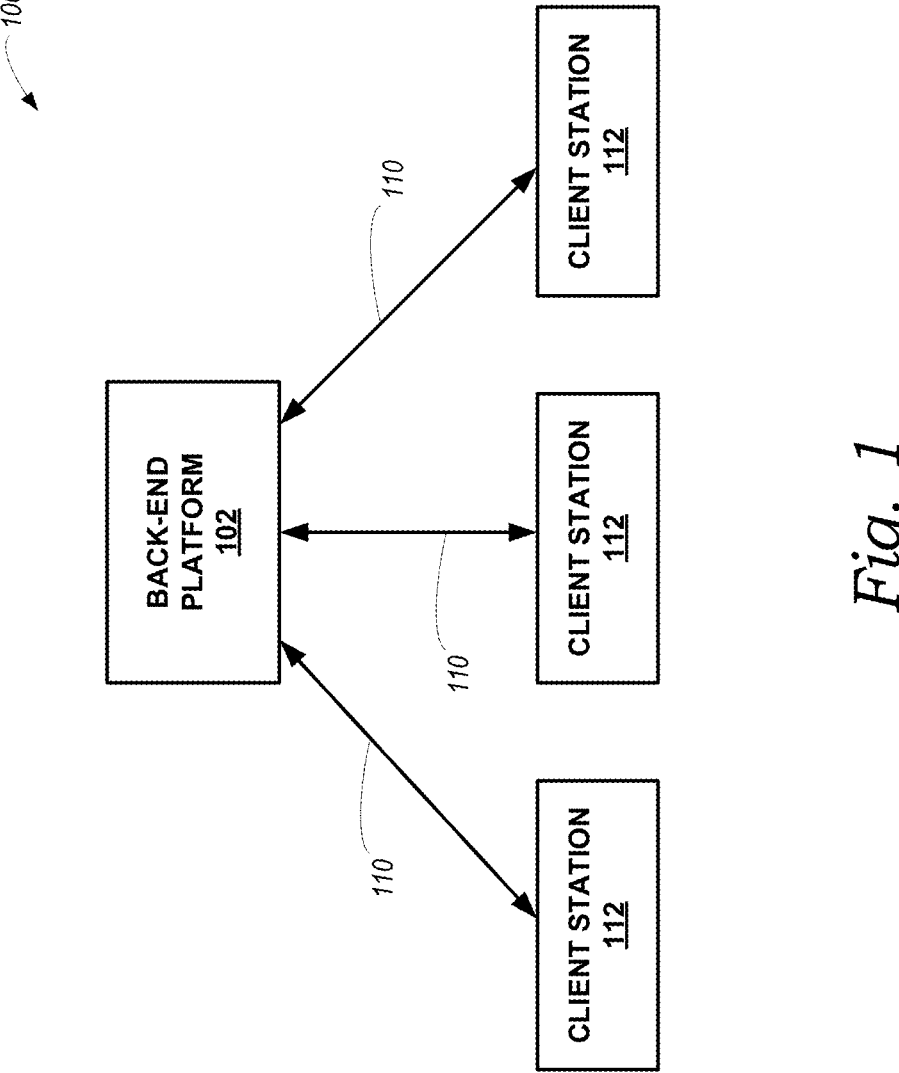
FIG. 1 depicts an example network configuration in which example embodiments may be implemented.

Features, aspects, and advantages of the presently disclosed technology may be better understood with regard to the following description, appended claims, and accompanying drawings, as listed below. The drawings are for the purpose of illustrating example embodiments, but those of ordinary skill in the art will understand that the technology disclosed herein is not limited to the arrangements and/or instrumentality shown in the drawings.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. Example System Configuration

The present disclosure is generally directed to a software tool for engaging in pattern matching between two two-dimensional drawings. The disclosed software tool may be used in many different contexts, one of which is in connection with technology for managing construction projects. In particular, the disclosed software tool may be used in connection with technology that renders a three-dimensional view of a construction project and generates additional two-dimensional views based on the three-dimensional view. As one possible implementation, this software technology may include both front-end software running on client stations that are accessible to individuals associated with construction projects (e.g., contractors, project managers, architects, engineers, designers, etc.) and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform. The software technology disclosed herein may take other forms as well.

In general, such front-end client software may enable one or more individuals responsible for a construction project to perform various tasks related to the management of the construction project, which may take various forms. According to some implementations, these tasks may include: rendering three-dimensional views of the construction project, navigating through the various three-dimensional views of the construction project in order to observe the construction project from various perspectives, and using the software to generate two-dimensional drawings, as some non-limiting examples. Further, such front-end client software may take various forms, examples of which may include a native application (e.g., a mobile application) and/or a web application running on a client station, among other possibilities.

Turning now to the figures, FIG. 1 depicts an example network configuration 100 in which example embodiments of the present disclosure may be implemented. As shown in FIG. 1, network configuration 100 includes a back-end platform 102 that may be communicatively coupled to one or more client stations, depicted here, for the sake of discussion, as client stations 112.

Broadly speaking, back-end platform 102 may comprise one or more computing systems that have been provisioned with software for carrying out one or more of the functions disclosed herein, including but not limited to rendering three-dimensional views of models of a construction project, and/or transmitting data and/or instructions that cause one or more client stations 112 to output information related to a construction project, including the rendered views of the three-dimensional model of the construction project. The one or more computing systems of back-end platform 102 may take various forms and be arranged in various manners.

For instance, as one possibility, back-end platform 102 may comprise computing infrastructure of a public, private, and/or hybrid cloud (e.g., computing and/or storage clusters) that has been provisioned with software for carrying out one or more of the functions disclosed herein. In this respect, the entity that owns and operates back-end platform 102 may either supply its own cloud infrastructure or may obtain the cloud infrastructure from a third-party provider of "on demand" computing resources, such include Amazon Web Services (AWS) or the like. As another possibility, back-end platform 102 may comprise one or more dedicated servers that have been provisioned with software for carrying out one or more of the functions disclosed herein. Other implementations of back-end platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end platform 102 is configured to interact with client stations 112 over respective communication paths 110. In this respect, each communication path 110 between back-end platform 102 and one of client stations 112 may generally comprise one or more communication networks and/or communications links, which may take any of various forms. For instance, each respective communication path 110 with back-end platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end platform 102 may be wireless, wired, or some combination thereof, and may carry data according to any of various different communication protocols. Although not shown, the respective communication paths 110 between client stations 112 and back-end platform 102 may also include one or more intermediate systems. For example, it is possible that back-end platform 102 may communicate with a given client station 112 via one or more intermediary systems, such as a host server (not shown). Many other configurations are also possible.

The interaction between client stations 112 and back-end platform 102 may take various forms. As one possibility, client stations 112 may send certain user input related to a construction project to back-end platform 102, which may in turn trigger back-end platform 102 to take one or more actions based on the user input. As another possibility, client stations 112 may send a request to back-end platform 102 for certain project-related data and/or a certain front-end software module, and client stations 112 may then receive project-related data (and perhaps related instructions) from back-end platform 102 in response to such a request. As yet another possibility, back-end platform 102 may be configured to "push" certain types of project-related data to client stations 112, such as rendered three-dimensional views, in which case client stations 112 may receive project-related data (and perhaps related instructions) from back-end platform 102 in this manner. As still another possibility, back-end platform 102 may be configured to make certain types of project-related data available via an API, a service, or the like, in which case client stations 112 may receive project-related data from back-end platform 102 by accessing such an API or subscribing to such a service. The interaction between client stations 112 and back-end platform 102 may take various other forms as well.

In practice, client stations 112 may each be operated by and/or otherwise associated with a different individual that is associated with a construction project. For example, an individual tasked with the responsibility for creating project-related data, such as data files defining three-dimensional models of a construction project may access one of the client stations 112, whereas an individual tasked with the responsibility for reviewing and revising data files defining three-dimensional models of a construction project may access another client station 112, whereas an individual tasked with the responsibility for performing work related to project-related data, such as an on-site construction professional may access yet another client station 112. However, client stations 112 may be operated by and/or otherwise associated with individuals having various other roles with respect to a construction project as well. Further, while FIG. 1 shows an arrangement in which three particular client stations are communicatively coupled to back-end platform 102, it should be understood that an arrangement may include more or fewer client stations.

Although not shown in FIG. 1, back-end platform 102 may also be configured to receive project-related data from one or more external data sources, such as an external database and/or another back-end platform or platforms. Such data sources—and the project-related data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. Example Computing Device

Figure 2:
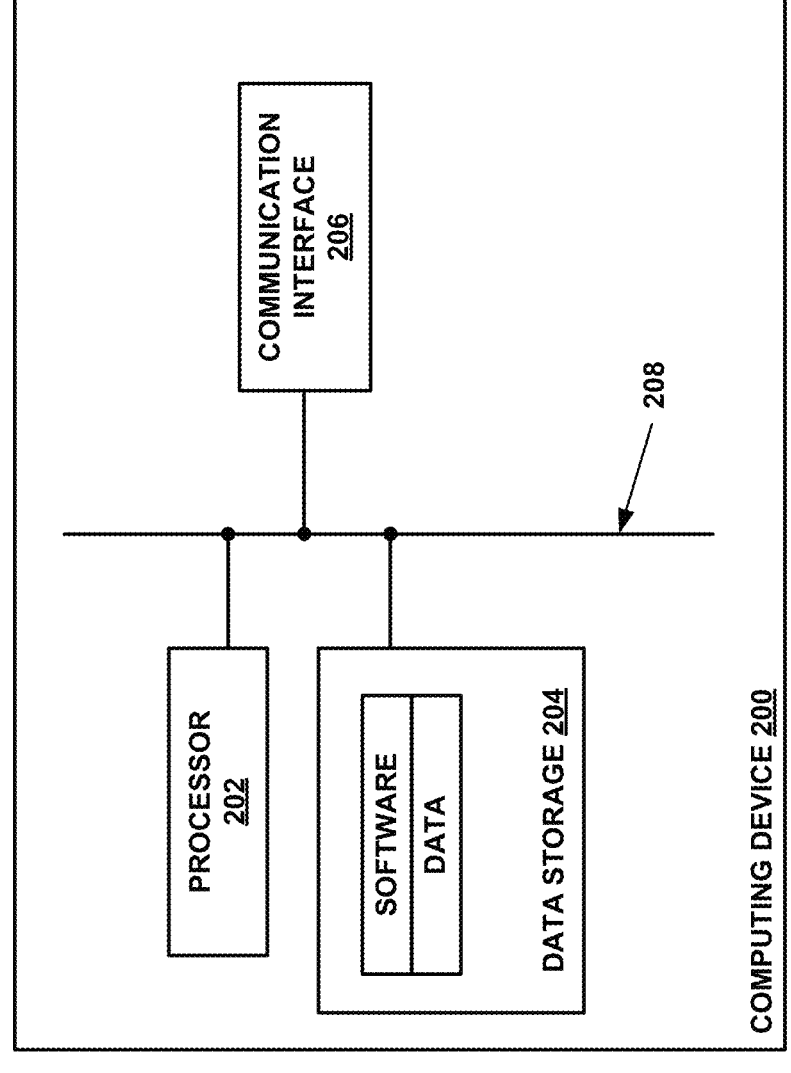
FIG. 2 depicts an example computing platform that may be configured to carry out one or more of the functions of the present disclosure.

FIG. 2 is a simplified block diagram illustrating some structural components that may be included in an example computing device 200, which could serve as, for instance, the back-end platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud.

As shown in FIG. 2, data storage 204 may be provisioned with software components that enable the computing device 200 to carry out the operations disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, data storage 204 may be arranged to store project-related data in one or more databases, file systems, or the like. Data storage 204 may take other forms and/or store data in other manners as well.

Communication interface 206 may be configured to facilitate wireless and/or wired communication with other computing devices or systems, such as one or more client stations 112 when computing device 200 serves as back-end platform 102, or as back-end platform 102 when computing device 200 serves as one of client stations 112. As such, communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. Communication interface 206 may also include multiple communication interfaces of different types. Other configurations are possible as well.

Although not shown, computing device 200 may additionally include one or more other interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. Example Visual Representations of Construction Projects

As mentioned above, one aspect of managing a construction project involves the creation, review, and sometimes revision, of plans for the construction project. These plans assist construction professionals in carrying out the construction project. For example, some plans include written statements, such a punch list or submittal log, which may communicate, for instance, what materials are needed during construction. Other plans may include visual representations of the construction project that visually communicate to the construction professionals how to assemble or construct the project.

Depending on the type of construction project, these visual representations tend to take one of two different forms. As one possibility, these visual representations may take the form of a set of two-dimensional technical drawings, such as architectural drawings, engineering schematics, or construction blueprints, among others. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process. Set forth below is a short overview of each of these types of visual representations of construction projects.

A. Two-Dimensional Technical Drawings

Figure 3:
FIG. 3 depicts an example two-dimensional technical drawing.

As mentioned, one way to visually represent information about a construction project is through two-dimensional technical drawings. Generally, a two-dimensional technical drawing serves to visually communicate a limited amount of information about the construction project in order to aid in the construction, or the further design, of the project. To illustrate, FIG. 3 depicts one example of a two-dimensional technical drawing in the form of an architectural drawing 300, which may visually communicate how the construction project is laid out. To do this, an architectural drawing, such as architectural drawing 300 may comprise a scaled drawing depicting certain foundational elements of the construction project (e.g., floors, walls, ceilings, doorways, and support elements), with perhaps visual indications of additional relevant aspects of these foundational elements, such as measurements, dimensions, materials, etc.

Another example of a two-dimensional technical drawing is a schematic that visually communicates how the heating, ventilation, and air conditioning (HVAC) ductwork is routed throughout the building. Like the architectural drawing, this schematic may visually communicate the HVAC ductwork routing through the use of a scaled depiction of the ductwork along with indications of other relevant aspects of the ductwork, such as measurements, dimensions, materials, etc.

Because technical drawings such as these are limited to two dimensions, multiple technical drawings may be used when there is a need to visually communicate aspects from a third (e.g., vertical) dimension. For instance, a construction project may comprise multiple floors and the design of the project may call for the shape or structure to change from floor to floor. In such a case, there may be one (or more) technical drawings for each floor of the construction project. And although just two example types of technical drawings were mentioned above, a typical construction project may involve the use of many other types of other technical drawings, including for instance technical drawings associated with landscaping, electrical, plumbing, installation, etc. For these reasons, a single construction project may involve the use of tens, hundreds, or perhaps, thousands of technical drawings.

Generally, two-dimensional technical drawings, like the two examples described above, are created at the outset of a construction project by architects, designers, engineers, or some combination thereof. Traditionally, these professionals would construct such two-dimensional technical drawings by hand. But today, professionals typically construct two-dimensional technical drawings with the aid of computer drafting software, such as existing CAD software known and used by professionals in the industry.

Two-dimensional technical drawings have advantages. For instance, a single two-dimensional technical drawing can visually communicate vast amounts of useful information. In some cases, construction professionals can get an overview of an entire area of a construction project by referring to a single technical drawing. Moreover, once created, technical drawings require a relatively small amount of computer storage and processing power to store and view. Construction professionals can often review finished technical drawings with off-the-shelf software document viewers, such as portable document format (PDF) software viewers.

Yet two-dimensional technical drawings have certain limitations. For instance, because these technical drawings are typically created at the outset of the construction project—that is, well before construction has actually begun—these drawings generally will not reflect changes to the project that happen during, say, the construction phase. When a change to the construction project happens after the technical drawings are completed, architects, designers, or engineers may be called upon to revise the existing technical drawings or create new drawings altogether to reflect the change.

Additionally, technical drawings that are generated at the outset of the construction project may not always visually communicate the specific information desired by the construction professional who later accesses the technical drawings. For instance, during construction a construction professional may determine that it would be useful to have a technical drawing, such as an architectural plan, that shows only support structures made of concrete and does not show support structures made from other materials, such as steel. But such a technical drawing may not be readily accessible because the complete set of technical drawings may have been already completed by that point. Thus, the construction professional may have to wait, or go without, his or her desired technical drawing. As mentioned, one solution to this issue would be to call upon an engineer, designer, or architect to regenerate the technical drawings with this requested information. But this is often a costly and time-consuming process, which may not be feasible depending on the project's budget as well as the stage of construction.

Still additionally, two-dimensional technical drawings tend to lack real coordinate information. For instance, a construction project is typically associated with what is referred to as a "real coordinate system." This real coordinate system may generally be a system of coordinates in three space and expressed in real units (e.g., feet or meters). At the outset of a project, a planner may apply a real coordinate system to a construction project, such that any location within the construction project can be expressed in terms of the real coordinate system. As an example, in the physical space in which the project will be constructed, a planner may arbitrarily select one corner of this space to be the origin (i.e., the (0, 0, 0) coordinate), and may select one direction to be the "X" direction, one direction to be the "Y" direction, and one direction to be the "Z" direction. Thus, when, for example, reference is made to a location at (15, 50, 50), construction professionals will understand that reference is being made to a location in the physical space in which the project will be constructed that is 15 feet in the X-direction, 50 feet in the Y-direction, and 50 feet in the Z-direction away from the origin location. In addition to making reference to actual locations within the physical space in which the project will be constructed, construction professionals may also understand that if reference is made to a physical element (such as a wall) that begins at real X-Y coordinates (150, 900) and spans to real X-Y coordinate (150, 1100), that physical element is 200 feet long. Other units are possible as well.

As mentioned, however, two-dimensional technical drawings may not be expressed in this real coordinate system or otherwise indicate what the real coordates are of any physical elements depicted the two-dimensional drawings. Instead, two-dimensional drawings may be expressed in what is referred to as a "pixel coordinate system." In a pixel coordinate system, each pixel in the drawing can be represented by an X-Y coordinate representing how many pixels away that pixel is from an arbitrary origin pixel, typically the first pixel in one of the corners of the drawing. Thus, for a line on a two-dimensional drawing depicting a physical element of the construction project (e.g., a wall), a construction professional can determine how many pixels long such an element is but typically cannot readily determine how long that element is in real units (e.g., feet or meters).

B. Three-Dimensional Visual Representations

As also mentioned, another way to visually represent information about a construction project is through a computerized, three-dimensional model of the construction project. In order to facilitate the creation and use of a computerized, three-dimensional model of the construction project, a team of architects, designers, and/or engineers engage in a process referred to as Building Information Modeling.

As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on that file or those files, is configured to cause a computing device to render a three-dimensional view of the computerized representation of the construction project. This view is referred to herein as a "three-dimensional BIM view" or simply a "three-dimensional view."

In order for BIM viewer software to be able to cause a computing device to render a three-dimensional view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for this building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project (e.g., an air duct) as a mesh of geometric triangles such that when the geometric triangles are visually stitched together by BIM viewer software, the triangles form a mesh, which represents a scaled model of the physical component (e.g., the air duct). In this respect, the BIM file may contain data that represents each triangle of a given mesh as set of coordinates in three-space. For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). In some BIM implementations, these coordinates are expressed in the real coordinate system of the construction project. A given mesh may be comprised of thousands, tens of thousands, or even hundreds of thousands of individual triangles, where each triangle may have a respective set of three vertices and corresponding sets of three-space coordinates for those vertices. However, other ways for a BIM file to contain data that represents each individual physical component in a construction project are possible as well.

Figure 4:
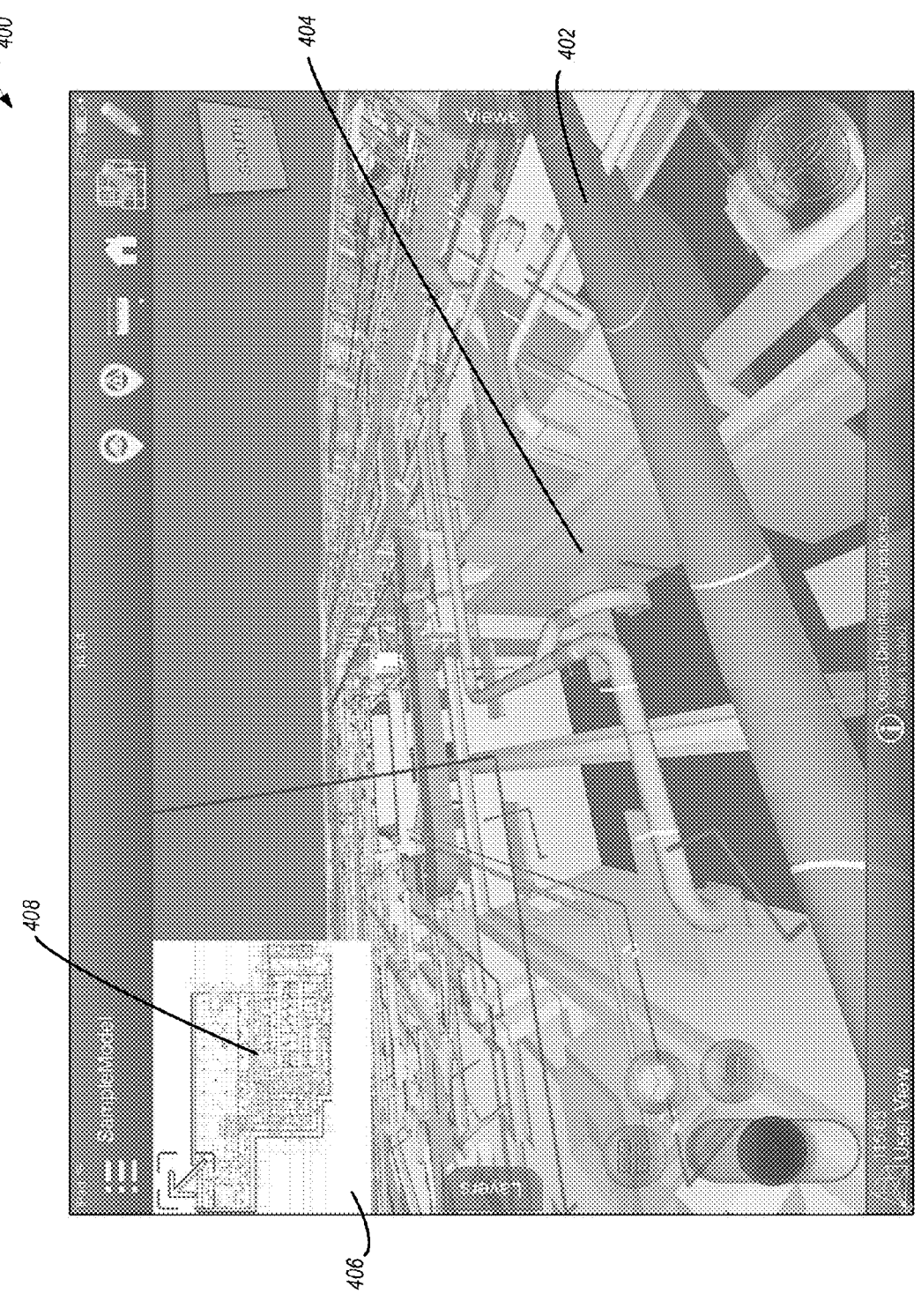
FIG. 4 depicts an example three-dimensional BIM view, in accordance with one embodiment of the present disclosure.

To illustrate one example of a three-dimensional view, FIG. 4 depicts an example snapshot 400 of a GUI, which includes a three-dimensional view of a construction project rendered at a particular perspective. Snapshot 400 may be generated by, for instance, a software tool running on a client station, such as one of client stations 112 (FIG. 1), accessing a BIM file, and then rendering a three-dimensional view of the construction project based on that BIM file and presenting it via a display interface of that client station. Alternatively, a back-end platform, such as back-end platform 102 (FIG. 1) may access a BIM file and may generate a set of instructions for rendering a three-dimensional view of the construction project based on that BIM file. Back-end platform 102 may then send these instructions to one of client stations 112, which in turn may present a three-dimensional view of the construction project it via a display interface of that client station based on these instructions. Still other arrangements are possible.

As depicted, snapshot 400 includes a three-dimensional view of a construction project from a particular perspective. The three-dimensional view depicted in FIG. 4 includes a number of meshes that represent individual physical components of the construction project, such as floors, walls, pipes, and ducts, etc. In particular, depicted in FIG. 4 is, among others, a mesh 402, which represents an air duct, and a mesh 404, which represents a wall. Of course, in other examples, other meshes are possible as are other layouts and designs of construction projects.

The client station presenting snapshot 400 may be configured to adjust the perspective at which the three-dimensional view is presented in response to, for instance, receiving user inputs at the client station. The client station may do this in various ways. As one possibility, the client station may reposition the perspective either forward or backward along an x-axis of the model in response to receiving a first type of user input via a peripheral, such as pressing the up arrow or down arrow on a keyboard or a click and drag with a mouse. The client station may reposition the perspective laterally along a y-axis of the model in response to receiving a second type of user input via a peripheral, such as pressing the left arrow or right arrow on a keyboard or a different type of click and drag with a mouse. The client station may reposition the perspective either up or down along a z-axis of the model in response to receiving a third type of user input via a peripheral, such as pressing a combination of keys on a keyboard (e.g., the Control key and the up arrow, or the Control key and the down arrow) or yet a different type of click and drag with a mouse. The client station may reposition the orientation of the perspective (i.e., the "camera" angle) in response to receiving a fourth type of user input via a peripheral, such as pressing a combination of keys on a keyboard (e.g., the Alt key and the up arrow, or the Control key and the down arrow) or yet a different type of click and drag with a mouse.

As another possibility, the computing device may reposition the perspective simultaneously along a combination of one or more of the x-axis, the y-axis, and the z-axis of the model in response to receiving a first type of user input at a touch-screen of the computing device, such as a touch and drag gesture made with one finger. The computing device may reposition the orientation of the perspective in response to receiving a second type of user input at a touch-screen of the computing device, such as a touch and drag gesture made with two fingers. However, other examples of adjusting the perspective at which the three-dimensional view is presented are possible as well.

In addition to data describing the individual triangles of a mesh, some BIM files may contain additional data that helps to summarize information relating to the various meshes. For instance, a BIM file may contain, for each mesh, data describing a "bounding box." Conceptually, a bounding box is an imaginary box surrounding the mesh on all sides, with the edges of this box being located at the outermost edges of the mesh. As such, the entire mesh fits inside of this bounding box with no part of the mesh protruding from the bounding box. In this way, the bounding box represents the maximum dimensions of the mesh in rectangular form. BIM viewer software may utilize bounding boxes stored in BIM files in various ways. For instance, it usually takes less storage space to store data describing a bounding box compared to data describing an entire mesh. This is due to the fact that a mesh may comprise of many thousands of triangles in order to accurately represent the mesh's surface, which in some cases is irregular (e.g., the curved surface of a pipe), whereas a bounding box can typically be represented by data describing just eight vertices of a rectangular box. Some BIM viewer software may be configured to operate in a mode designed to conserve processing power and/or storage space in which the BIM viewer software causes a computing device to render just bounding boxes as opposed to rendering the full meshes. By doing so, the BIM viewer software can visually communicate a "low resolution" version of the construction project. Other ways of utilizing bounding boxes, and other ways of containing additional data to help summarize information relating to the various meshes, are possible as well.

BIM files may contain additional data as well, including data describing other attributes of the individual physical elements of the construction project that may or may not be related to the element's specific position in three space. By way of example, this data may include data describing what system or sub-system the component is associated with (e.g., structural, plumbing, HVAC, electrical, etc.), data describing what material or materials the individual physical element is made of; what manufacturer the element comes from; what stage of manufacture the element is in; where the element currently resides (e.g., data indicating that the element is on a truck for delivery to the construction site, and/or once delivered, data indicating where at the construction site the delivered element resides); and/or various identification numbers assigned to the element (e.g., a serial number, part number, model number, tracking number, etc.), as well as others.

Together, these other attributes are generally referred to as metadata. BIM viewer software may utilize this metadata in various ways. For instance, some BIM viewer software may be configured to present different views based on metadata (e.g., displaying all meshes that represent HVAC components but hiding all meshes that represent plumbing components; and/or displaying meshes representing metal components in a certain color and displaying meshes representing wood components in another color, etc.). Alternatively or additionally, BIM viewers can display certain subsets of the metadata based on user input. For example, a user may provide a user input to the BIM viewer software though a click or tap on a GUI portion displaying a given mesh, and in response, the BIM viewer software may cause a GUI to display some or all of the attributes of the physical element represented by the given mesh. Other examples are possible as well.

As mentioned, BIM viewer software is generally deployed on client stations, such as client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

BIM technology has advantages. For instance, as described, BIM viewers can use BIM files in order to render three-dimensional views (such as the view depicted in snapshot 400 in FIG. 4) of various elements of the construction project. This can help construction professionals identify potential construction issues prior to encountering those issues during construction as well as conceptualize what the finished building will look like.

BIM technology can help address some drawbacks associated with two-dimensional technical drawings. For instance, as mentioned, one drawback associated with two-dimensional drawings is that they may not be expressed in (or otherwise indicate) a construction project's real coordinate system. To help address this, some BIM viewer technology provides the capability to generate a top-down two-dimensional drawing of a portion of a construction based on a particular 3D BIM view of that portion of the construction project. If the BIM file contains information regarding the real coordinate system of the construction project, then this real coordinate system data may be translated onto the generated top-down two-dimensional drawing. This top-down two-dimensional drawing may then be compared to one or more traditional two-dimensional technical drawings, such as a PDF construction plan or blueprint (which, as mentioned above, may be expressed in a pixel coordinate system), in order to assess whether the two-dimensional technical drawing depicts or describes the same portion of the construction project being displayed by the 3D BIM viewer. If the two-dimensional technical drawing depicts or describes the same portion of the construction project, then the real coordinate system from the BIM file can be mapped onto the two-dimensional technical drawing, which may provide several advantages for construction professionals, including the ability to supplement the two-dimensional technical drawing with additional measurement information or even information that may have been tagged to a real coordinate location on another two-dimensional technical drawing.

However, depending on the implementation, this comparison between the generated top-down two-dimensional drawing and the retrieved two-dimensional technical drawing may be a slow cumbersome process or may fail altogether, which results in a poor user experience. For instance, in some cases, one or both of the two-dimensional technical drawings under comparison may have hundreds, if not thousands, of lines. This may require an overwhelming number of computing resources to resolve, making comparison using traditional computer vision and pattern matching techniques a slow process. In other cases, one of the two-dimensional technical drawings may be at a different size or scale than the other two-dimensional technical drawing, which may also result in a slow process as well.

IV. Example Operations

Disclosed herein is new software technology that is designed to help remedy some of the aforementioned limitations with technology for matching two two-dimensional technical drawings. For instance, disclosed herein is a software tool that engages in a pattern matching technique. In one example implementation, the disclosed pattern matching technique may be used to determine whether two (or more) two-dimensional technical drawings depict the same portion of a construction project, such as the same floor of a building. Advantageously, the disclosed pattern matching technique may make this determination even if the two (or more) two-dimensional technical drawings are of different scales.

Example operations that may be carried out by one or more computing devices running the disclosed software tool are discussed in further detail below. For purposes of illustration only, these example operations are described as being carried out by a computing device, such as computing device 200 (FIG. 2), which as described above, may serve as one or more of client stations 112 (FIG. 1) and/or back-end platform 102 (FIG. 1). In this respect, it should be understood that, depending on the implementation, the operations discussed herein below may be carried out entirely by a single computing device, such as one or more of client stations 112 or by back-end platform 102, or may be carried out by a combination of computing devices, with some operations being carried out by back-end platform 102 (such as computational processes and data-access operations) and other operations being carried out by one or more of client stations 112 (such as display operations and operations that receive user inputs). However, other arrangements are possible as well.

To help describe some of these operations, flow diagrams may also be referenced to describe combinations of operations that may be performed by a computing device. In some cases, a block in a flow diagram may represent a module or portion of program code that includes instructions that are executable by a processor to implement specific logical functions or steps in a process. The program code may be stored on any type of computer-readable medium, such as non-transitory computer readable media (e.g., data storage 204 (FIG. 2)). In other cases, a block in a flow diagram may represent circuitry that is wired to perform specific logical functions or steps in a process. Moreover, the blocks shown in the flow diagrams may be rearranged into different orders, combined into fewer blocks, separated into additional blocks, and/or removed, based upon the particular embodiment. Flow diagrams may also be modified to include additional blocks that represent other functionality that is described expressly or implicitly elsewhere herein.

With reference now to flow diagram 500 of FIG. 5, one example of a process carried out in accordance with the disclosed software tool for engaging in a pattern matching technique is illustrated and described. In practice, this process may be commenced while the computing device is presenting a two-dimensional technical drawing or a three-dimensional BIM view via a GUI. For example, in a scenario in which a user has requested generation of a top-down two-dimensional drawing based on a displayed three-dimensional BIM view, one aspect of this generation may involve a comparison to another technical drawing, such as a construction blueprint or other two-dimensional technical drawing in order to confirm that the generated top-down two-dimensional drawing and the other two-dimensional technical drawing depict the same portion of the construction project. Thus, at an appropriate point in the course of such generation, the computing device may commence the following process. However, other ways to commence the process are possible as well.

Once the process is commenced, the process may generally involve the following operations: (i) at block 502, the computing device retrieves a first two-dimensional drawing and identifies walls depicted on the first two-dimensional drawing as lines; (ii) at block 504, the computing device determines whether there at least a threshold number of lines are aligned with either the X or Y axes; (iii) if there are not at least a threshold number of lines aligned with either the X or Y axes, then the computing device proceeds to blocks 506, 508, and 510, where the computing device (a) at block 506, rotates the first two-dimensional drawing clockwise until a threshold number of lines align with either the X or Y axis, (b) at block 508, rotates the first two-dimensional drawing counter-clockwise until a threshold number of lines align with either the X or Y axis, and (c) determines which rotation (i.e., the clockwise rotation or the counter-clockwise rotation) yielded the least amount of rotation before at least the threshold number of lines were aligned with either the X or Y axes, and uses this rotation for the remainder of the steps, beginning at block 512; (iv) if, at block 504, there were at least a threshold number of lines already aligned with the X or Y axes, the computing devices uses the first two-dimensional drawing, in its unrotated form, for the remainder of the steps, beginning at block 512; (v) at block 512, the computing device discards identified lines that are not aligned with either the X or Y axis; (vi) at block 514, the computing device identifies intersection points between the remaining lines; (vii) at block 516, the computing device identifies a subset of intersection points that have a maximum or minimum coordinate; (viii) at block 518, for each respective point in the identified subset, the computing device constructs a data library indicative of the relative positions of the points in the identified subset relative to the given point; and (ix) at block 520, the computing device compares the constructed data libraries for the first two-dimensional drawing to data libraries constructed for another two-dimensional drawing, and based on such a comparison, the computing device may draw a conclusion as to whether the first two-dimensional drawing and the other two-dimensional drawing depict the same portion of a construction project. Each of these operations will now be discussed in further detail.

At block 502, the computing device may retrieve from data storage a first two-dimensional technical drawing file, such as a CAD drawing or an architectural plan that exists in electronic form (e.g., PDF). For instance, as one possibility, the computing device may retrieve the technical drawing file in response to receiving a user input directing the computing device to the location in data storage of the technical drawing file. However, other ways of retrieving a technical drawing file from data storage are possible as well.

Once retrieved, the computing device may identify all walls depicted in the two-dimensional drawing as lines. The computing device may carry this out this function using any known computer vision technique for identifying lines. In doing this, the computing device may, for instance, identify the lines within the two-dimensional drawing and ignore or discard any depictions that are not lines, such as dimensioning indications, text, or other symbols or markup.

Figure 6A:
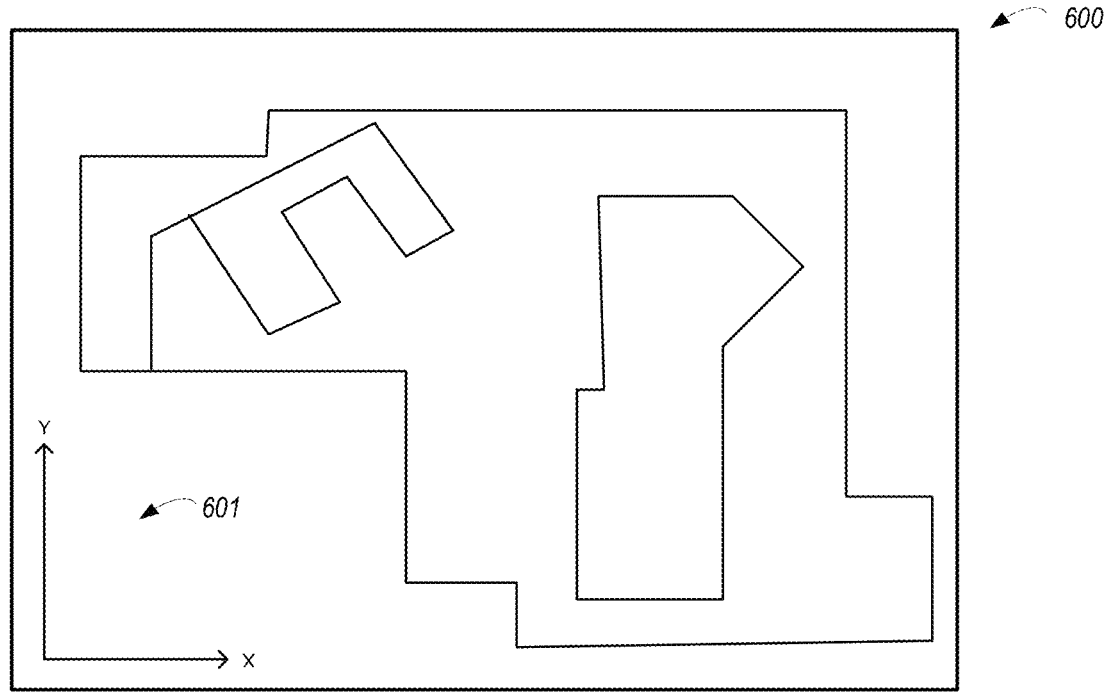
FIG. 6A depicts an example simplified two-dimensional drawing, in accordance with one embodiment of the present disclosure.

At block 504, the computing device may determine whether there are at least a threshold number of lines on the two-dimensional drawing that are aligned with either an x-axis or a y-axis. In order to do this, the computing device may first assign a coordinate system to the two-dimensional drawing, with, for example, the origin of the coordinate system positioned at the bottom left corner of the two-dimensional drawing, a y-axis extending generally vertically along the two-dimensional drawing, and an x-axis extending generally laterally along the two-dimensional drawing. To help illustrate one example of such a coordinate system, FIG. 6A depicts a simplified version of an example two-dimensional drawing 600, with the direction of an x-axis and y-axis being generally depicted by indicator 601. In other examples, however, other coordinate systems are possible with x- and y-axes being oriented in different directions along the two-dimensional drawing.

In one implementation, the computing device may determine whether there are at least a threshold number of lines on the two-dimensional drawing (e.g., 75% of all line segments present in the two-dimensional drawing) that are aligned with either an x-axis or a y-axis by measuring the angle each line segment makes with both the x-axis and the y-axis. In this respect, a line segment exactly parallel to the y-axis will a have a 0° difference angle to the y-axis, and a line segment exactly parallel to the x-axis will have a 0° difference angle to the x-axis. Thus, the computing device may consider any line segment having at most a threshold difference angle (e.g., 5°) to either the x-axis or the y-axis to be aligned with the x-axis or y-axis. Other ways of determining whether there are at least a threshold number of lines on the two-dimensional drawing that are aligned with either an x-axis or a y-axis are possible, as are other threshold numbers of lines and threshold angles.

If there are at least a threshold number of lines on the two-dimensional drawing that are aligned with either the x-axis or a y-axis, then the process proceeds to block 512. However, if there are not at least a threshold number of lines on the two-dimensional drawing that are aligned with either the x-axis or a y-axis, then the process proceeds to blocks 506, 508, and 510 before returning to block 512. These blocks are described in sequence, below.

At blocks 506 and 508, the computing device rotates the two-dimensional drawing clockwise (block 506) and counter-clockwise (block 508) until at least the threshold number of lines on the two-dimensional drawing that are aligned with either the x-axis or a y-axis. In one implementation of these rotations, the computing device may engage in an iterative process whereby the computing device (a) rotates the two-dimensional drawing by a threshold number of degrees (e.g., 2°), (b) determines whether there are at least a threshold number of lines on the two-dimensional drawing that are aligned with either the x-axis or a y-axis (by, for instance, engaging in the same or similar operations to those described in connection with block 504), and (c) and if there are not at least a threshold number of lines on the two-dimensional drawing that are aligned with either the x-axis or a y-axis after the rotation, the computing device executes another iteration of the iterative process. Other examples of rotates the two-dimensional drawing until at least the threshold number of lines on the two-dimensional drawing that are aligned with either the x-axis or a y-axis are possible.

At block 510, once the computing device completes the rotation of the two-dimensional drawing in the clockwise direction (block 506) and the counter-clockwise direction (block 508), the computing device determines which of the two rotations resulted in at least a threshold number of lines on the two-dimensional drawing that are aligned with either the x-axis or a y-axis and was rotated the least. The computing device uses this rotation of the two-dimensional drawing for the remainder of the process. For example, if at block 506 the computing device rotated the two-dimensional drawing 18° clockwise in order to get at least the threshold number of lines aligned with either the x-axis or the y-axis, and at block 508 the computing device rotated the two-dimensional drawing 6° counter-clockwise in order to get at least the threshold number of lines aligned with either the x-axis or the y-axis, then the computing device would use the 6°-counter-clockwise rotation of the two-dimensional drawing for the remainder of the process, beginning at block 512. Of course, other example rotations are possible as well.

At block 512, the computing device may next discard any line segments that are not aligned to at least a threshold extent with either the x-axis or the y-axis. In one implementation, the computing device may discard any line segments that have difference angles to both the x-axis and the y-axis that are greater than a threshold angle (e.g., 5°). Depending on the implementation, "discarding" a line segment may take various forms, such as the computing device refraining from further analysis and processing of the line segment in the disclosed process, and/or the computing device omitting the "discarded" line segment from a rendering of the two-dimensional drawing during the disclosed process. Other examples of discarding line segments are possible as well.

Figure 6B:
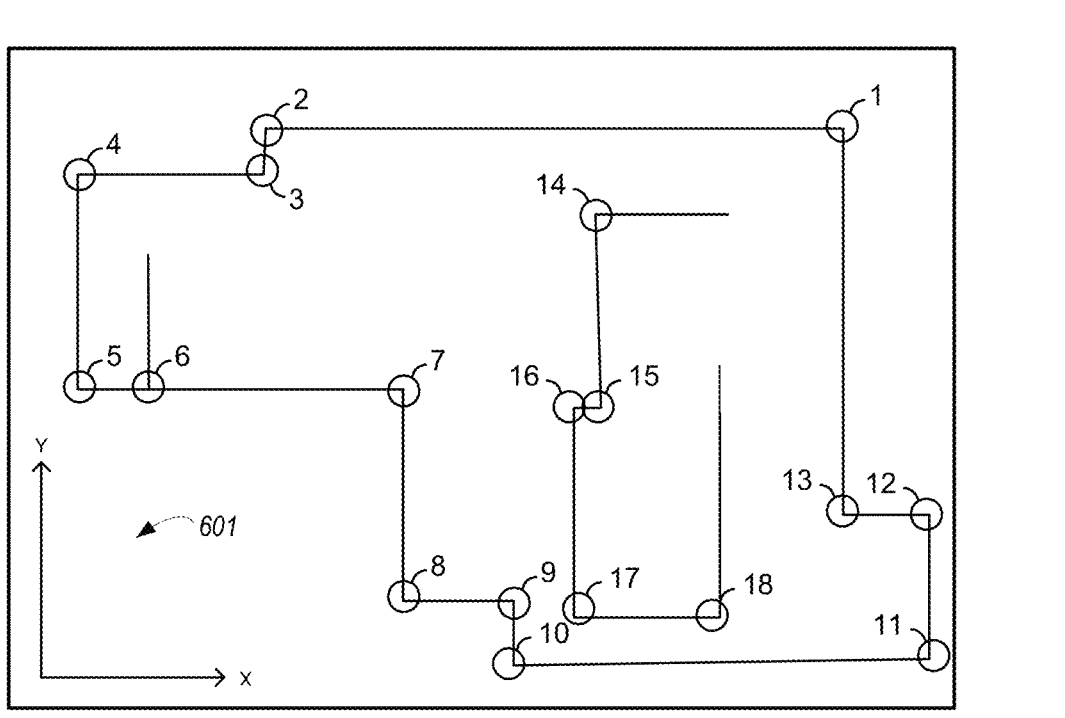
FIG. 6B depicts an example simplified two-dimensional drawing, in accordance with one embodiment of the present disclosure.

To help illustrate, FIGS. 6A and 6B each depict simplified versions of example two-dimensional drawings 600 and 602, respectively. Example two-dimensional drawing 600 contains several line segments that are aligned with either the x-axis or the y-axis, as well as several line segments that are not aligned with either the x-axis or the y-axis. Example two-dimensional drawing 602 depicts the example two-dimensional drawing from FIG. 6A but with certain line segments discarded, namely those line segments from example two-dimensional drawing 600 that were not aligned with either the x-axis or the y-axis. Other examples of two-dimensional drawings are possible as well.

At block 514, the computing device identifies the intersection points between the remaining line segments on the two-dimensional drawing. Generally, the computing device may identify an "intersection point" as any position on the two-dimensional drawing in which two line segments touch. By identifying these intersection points, the computing device may build a point cloud within the two-dimensional drawing, where each point in the point cloud is an intersection between two (or more) line segments. To help illustrate one example of an identification of intersection points on a two-dimensional drawing, FIG. 6B depicts an example two-dimensional drawing 602 with circles indicating identified intersection points 1-18. In other examples, however, other intersection points may be possible.

At block 516, the computing device may identify a subset of intersection points that each have either a maximum or a minimum coordinate. In other words, the computing device may identify those intersection points that are at the outermost edges of the two-dimensional drawing and may associate those intersection points into a subset of intersection points. The computing device may do this in a variety of ways. FIG. 7A is a flowchart 700 depicting one possibility and FIG. 7B is a flowchart 701 depicting another possibility. These flowcharts are described in further detail below, followed by a return to the process depicted by flowchart 500 in FIG. 5.

Turning first to flowchart 700 in FIG. 7A, at block 702, the computing device assigns X, Y coordinates to each identified intersection point. Consistent with the example set forth above, the computing device may assign coordinates to each identified intersection point in accordance with where each respective intersection point falls within the coordinate system assigned to the two-dimensional drawing at block 504. Returning to FIG. 6B to help illustrate this example, assuming the origin of an example coordinate system for two-dimensional drawing 602 is located at the bottom left corner of the drawing, then the computing device may assign example intersection point 1 the coordinates (70, 80) and assign example intersection point 5 the coordinates (5, 50). These coordinates are merely examples; other coordinate systems are possible as are other example coordinates.

At block 704, the computing device may identify the maximum and minimum x-coordinate and the maximum and minimum y-coordinate that were assigned to the intersection points at block 702. In one implementation of this, the computing device retrieves each coordinate pair assigned to each intersection point and identifies from among these coordinate pairs the minimum x-coordinate, the minimum y-coordinate, the maximum x-coordinate, and the maximum y-coordinate. For example, referring back to the intersection points 1-18 identified in example two-dimensional drawing 602, the minimum x-coordinate may be "5," which may be assigned to points 4 and 5; the minimum y-coordinate may be "20," which may be assigned to points 10 and 11; the maximum x-coordinate may be "75," which may be assigned to points 11 and 12; and the maximum y-coordinate may be "80," which may be assigned to points 1 and 2. Again, other example maxima and minima are possible in other example two-dimensional drawings and/or other example coordinate systems.

Figure 8A:
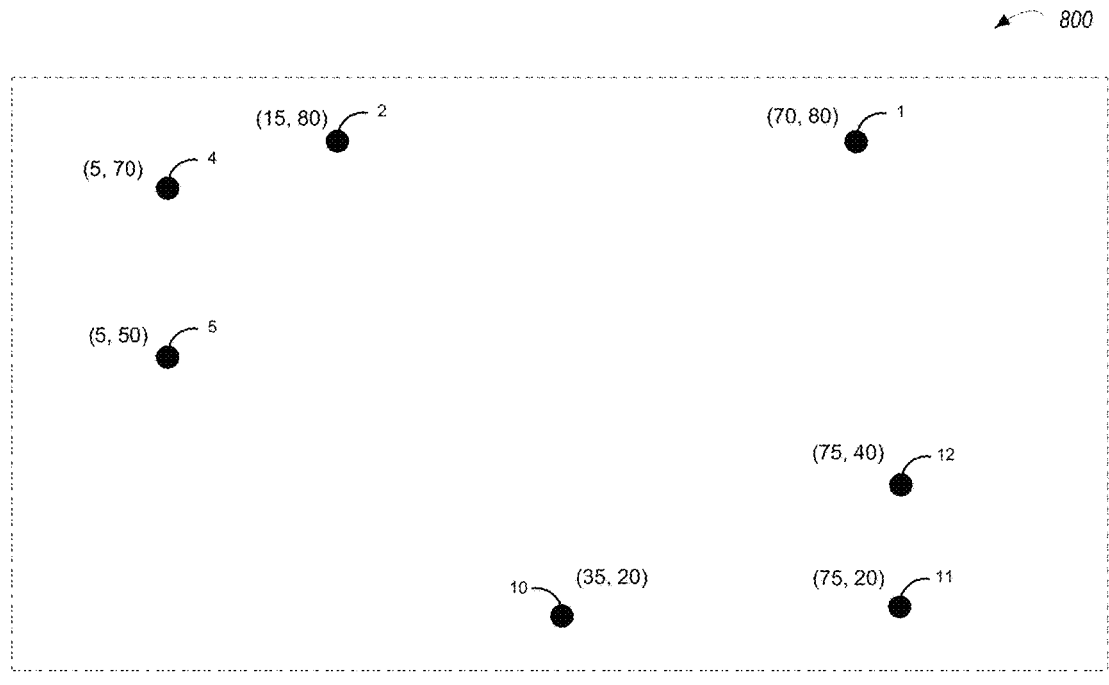
FIG. 8A depicts an example intersection point cloud, in accordance with one embodiment of the present disclosure.

Finally, at block 706, the computing device may use the identified maxima and minima coordinates to identify a subset of intersection points, in which each intersection point of the identified subset has either a maximum or minimum x-coordinate or y-coordinate. Returning again to the example depicted in FIG. 6B, the example intersection points identified as having either a maxima or minima coordinate may be intersection points 1, 2, 4, 5, 10, 11, and 12. As such, in this example, the computing device may identify these intersection points as comprising the subset of identified intersection points. To help illustrate this, FIG. 8A depicts the example subset of intersection points from two-dimensional drawing 602 (FIG. 6B) for which the computing device may have identified as having either a maxima or minima x-coordinate or y-coordinate. As depicted, these intersection points were the intersection points located at the outermost edges of two-dimensional drawing 602. Other examples of intersection points are possible as well.

Figures 8B, 8C, 8D:
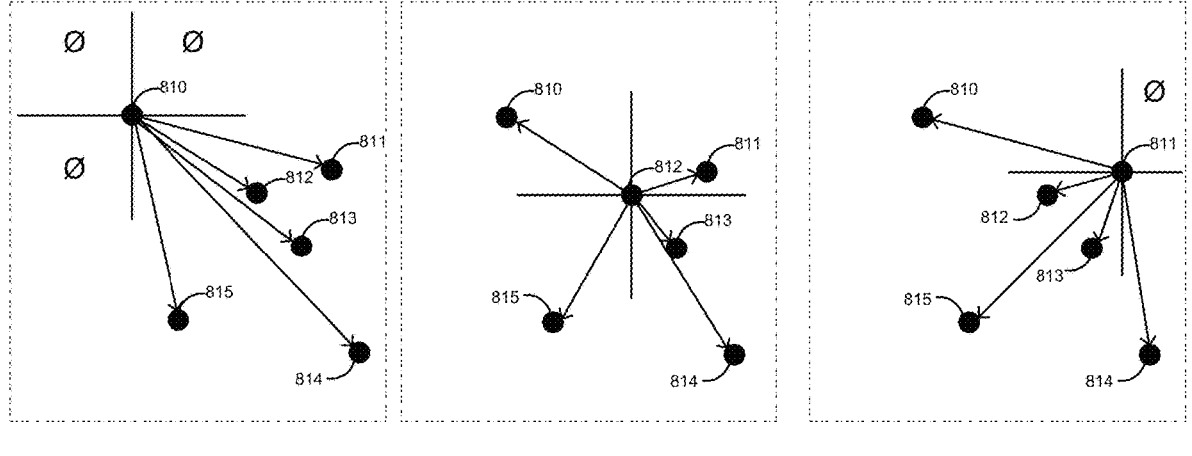
FIG. 8B depicts an example intersection point cloud, in accordance with one embodiment of the present disclosure.
FIG. 8C depicts an example intersection point cloud, in accordance with one embodiment of the present disclosure.
FIG. 8D depicts an example intersection point cloud, in accordance with one embodiment of the present disclosure.

Turning next to FIG. 7B, flowchart 701 depicts another possible implementation of identifying a subset of intersection points that each have either a maximum or a minimum coordinate. Beginning at block 708, the computing device may first, for each respective identified intersection point, divide the two-dimensional drawing into a Cartesian plane having four 90° quadrants with the origin of the Cartesian plane located at the respective intersection point. To illustrate examples of this, FIGS. 8B-D depict the same point cloud with points 810-815. In FIG. 8B, the Cartesian plane is located about point 810; in FIG. 8C, the Cartesian plane is located about point 812; and in FIG. 8D, the Cartesian plane is located about point 813. However, other examples of point clouds are possible as well.

At block 710, the computing device may, for each respective identified intersection point, determine whether there are any identified intersection points located in each 90° quadrant of the respective intersection point's Cartesian plane. Returning to FIGS. 8B-D to help illustrate, at FIG. 8B, the Cartesian plane is located at point 810. Thus, the computing device may determine that, for point 810, each other point 811-815 is located in quadrant "IV," whereas quadrants "I," "II," and "III" have no other identified intersection points located therein. Likewise, at FIG. 8C, the Cartesian plane is located at point 812. Thus, the computing device may determine that, for point 812, each point 811-815 is located in one of quadrants "I," "II," "III," and "IV." For instance, point 811 is located in quadrant "I"; point 810 is located in quadrant "II"; point 815 is located in quadrant "III"; and points 813 and 814 are located in quadrant "IV." Likewise, at FIG. 8D, the Cartesian plane is located at point 811. Thus, the computing device may determine that, for point 811, each other point is located in one of quadrants "II," "III," or "IV," whereas quadrant "I" has no other point located therein. As indicated earlier, other point clouds are possible in which other configurations of points being located within and without respective Cartesian quadrants are possible.

Finally, at block 812, the computing device may identify a subset of intersection points, in which each intersection point in the subset has at least one 90° quadrant that contains no other intersection points. In this way, the computing device may identify those intersection points that are located at the outermost edges of the two-dimensional drawing. To help conceptualize, if a given intersection point has a respective 90° quadrant that contains no other intersection points, then that intersection point is located at one of the maximum or minimum coordinates, and this this given intersection point would be included within the identified subset of intersection points. Likewise, if a given intersection point has other intersection points located within each of its four 90° quadrants, then that given intersection point is not located at any of the outermost edges of the two-dimensional drawing, and thus this given intersection point would not be included in the identified subset of intersection points.

The foregoing examples were two possible implementations whereby a computing device may identify intersection points that are at the outermost edges of a two-dimensional drawing. Other possibilities for identifying intersection points that are at the outermost edges of a two-dimensional drawing may exist as well.

Returning to block 518 in FIG. 5, once the computing device has identified a subset of intersection points that are located at the outermost edges of the two-dimensional drawing (via one of the above processes, or an alternative process), the computing device may then construct a data library for each respective intersection point in the subset. In one implementation, the data library for each respective intersection point contains data mappings that describe the locations of the other intersection points relative to the respective intersection point. This data mapping may take various forms, one of which may be a combination of (i) an angle that describes the relative orientation of another intersection point from the respective intersection point, and (ii) a coordinate value that describes the relative distance of another intersection point from the respective intersection point. The angle that describes the relative orientation of another intersection point may be calculated from any origin, but in one example an angle of 0° may represent a point straight above the respective intersection point (i.e., a point that shares the same x-coordinate but has a larger y-coordinate), an angle of 90° may represent a point straight to the right of the respective intersection point (i.e., a point that shares the same y-coordinate but has a larger x-coordinate), an angle of 180° may represent a point straight below the respective intersection point (i.e., a point that shares the same x-coordinate but has a smaller y-coordinate), and an angle of 270° may represent a point straight to the left of the respective intersection point (i.e., a point that shares the same y-coordinate but has a smaller y-coordinate). Other data mappings are possible as well.

Figure 9:
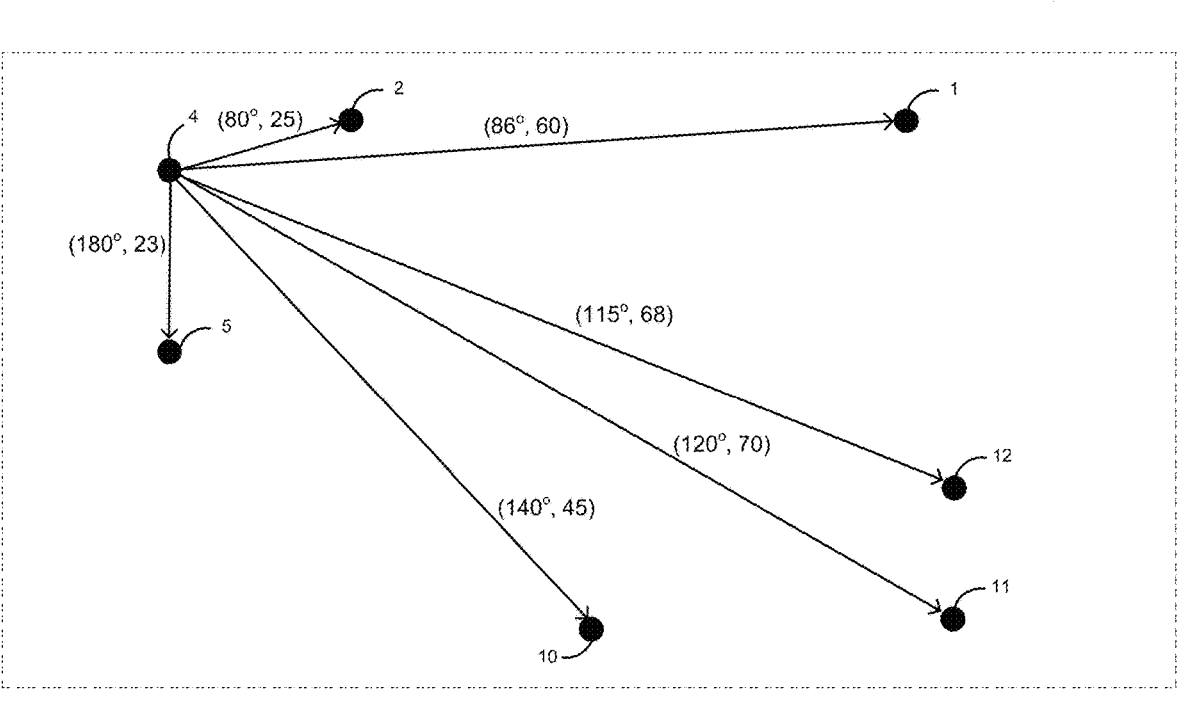
FIG. 9 depicts an example data library for an intersection point, in accordance with one embodiment of the present disclosure.

To help illustrate one example of a data library, FIG. 9 depicts an example data library that may be associated with point 4 of example data cloud 800. As depicted, the computing device may construct a data library for point 4 that includes one data mapping for each other intersection point on the two-dimensional drawing. For instance, the data library for point 4 may include a data mapping describing point 2 in the form of (80°, 25), which represents that point 2 is located at an angle of "80°" and a distance of "25" from point 4. In a similar fashion, the data library for point 4 may further include a data mapping (86°, 60) describing point 1, a data mapping (115°, 68) describing point 12, a data mapping (120°, 70) describing point 11, a data mapping (140°, 45) describing point 10, and a data mapping (180°, 23) describing point 5. Thus, the data library for point 4 may comprise each of these individual data mappings. As indicated at block 518 (FIG. 5), the computing device may construct a data library for each intersection point in the identified subset. Thus, in the example depicted in FIG. 9, the computing device may construct a data library for intersection points 1, 2, 5, 10, 11, and 12 in addition to the one constructed for data point 4. It should be understood that the foregoing was merely illustrative, and in other examples, other data mappings are possible, as are other data libraries.

Finally, at block 520, the computing device may compare the data libraries constructed for the first two-dimensional drawing (e.g., the data libraries constructed based on the foregoing description of flowchart 500, including blocks 502-518) to data libraries constructed for a second two-dimensional drawing. In one example, the data libraries for the second two dimensional drawing may have been previously constructed by the same or different computing device. In such a case, the computing device may retrieve the data libraries (e.g., from data storage 204) constructed for a second two-dimensional drawing and compare them to the data libraries constructed for the first two-dimensional drawing. In another example, the computing device may engage in a second iteration of the process depicted in FIG. 5 but with respect to a second two-dimensional drawing. Upon completion of block 518 of the second iteration of the process depicted in FIG. 5, at block 520, the computing device may then compare the data libraries constructed in the first iteration of the process (the first two-dimensional drawing) to the data libraries constructed in the second iteration of the process (the second two-dimensional drawing). Other configurations are possible as well.

The computing device may compare data libraries constructed for one two-dimensional drawing to data libraries constructed for another two-dimensional drawing in a number of different ways. As one possibility, the computing device may first select one data library from the first two-dimensional drawing and compare it to each data library of the second two-dimensional drawing in order to find a match. The computing device may do this by comparing each data mapping from the selected data library of the first two-dimensional drawing to each data mapping of one of the data libraries of the second two-dimensional drawing. The computing device may consider a comparison between two data mappings to result in a match if both the angle and the distance of the respective data mappings differ from one another by no more than a threshold amount (e.g., 2° for the angle, or 5% for the distance—although other examples of threshold amounts are possible). The computing device may consider a comparison between two data libraries to result in a match if there are at least a threshold number of matches (e.g., 75%) between individual data mappings across the two data libraries. And the computing device may consider that a first two-dimensional drawing is matched to a second two-dimensional drawing when at least a threshold number of data libraries (e.g., 75%) of the first two-dimensional drawing are matched with data libraries of the second two-dimensional drawing.

As another possibility, the computing device may apply a scale factor to one set of data libraries of one of the two-dimensional drawings under comparison. For instance, because the disclosed process utilizes data mapping in which one component thereof is an angle that describes the relative orientation of another intersection point, this angle component generally will remain the same no matter the scale of the two dimensional drawings. As such, the present process can be used to compare two two-dimensional drawings that are of different scales and determine whether these two two-dimensional drawings depict the same portion of a construction project. In particular, for two two-dimensional drawings that depict the same portion of a construction project but are of different scales, the disclosed process may produce data libraries for each two-dimensional drawing that have the same or similar angle components of the respective data mappings but different distance components. The distance components of the data mappings for these two-dimensional drawings will differ from one another by the scale factor between the two-dimensional drawings (e.g., if a first drawing is half the size of a second drawing, then the distance components of the data mappings for the first drawing will be half the size of the distance components of the data mappings for the second drawing whereas the angle components of the respective data mappings of the drawings should be the same or similar). Accordingly, applying a constant scale factor to the distance components of one set of data mappings may yield an affirmative comparison between the respective data libraries.

The computing device may apply a scale factor to one set of data libraries in any of a number of different ways. In one implementation, the computing device may apply a scale factor to a set of data mappings upon determining that a comparison between angle components of respective data libraries result in a match but a comparison between the distance components of these same data libraries do not result in a match. Such a determination may indicate that the two-dimensional drawings are of different scales. Accordingly, upon making such a determination, the computing device may determine a scale factor by dividing the distance component of one data mapping by the distance component of another mapping for two data mappings that have matching angle components. The computing device may then apply this scale factor to one set of data mappings by, for instance, multiplying the distance components of the data mappings for the appropriate one of the drawings.

For example, assume two data mappings (45°, 25) and (45°, 5) have been compared. In this example, the computing device may determine a scale factor by dividing 25 by 5, which results in 5. The computing device may then apply this scale factor to the (45°, 5) data mapping by multiplying 5 by 5, which results in a modified data mapping of (45°, 25). The computing device may then use this modified data mapping in its comparison. Other examples of applying scale factors are possible as well.

Once the computing device completes block 520 and determines, for instance, that a comparison between data libraries of a first two-dimensional drawing and data libraries of a second two-dimensional drawing resulted in at least a threshold number of data libraries from each drawing matching, the computing device may rely on this as a basis to conclude that the first two-dimensional drawing and the second two-dimensional drawings depict the same portion of a construction project. Depending on the implementation, the computing device may use this conclusion in any number of different ways.

As one possibility, the computing device may have been in the process of generating a functional two-dimensional inset to use in connection with a three-dimensional BIM view, such as the process disclosed in co-owned and co-pending U.S. patent application Ser. No. 16/277,679, titled "Generating Technical Drawings From Building Information Models," filed Feb. 15, 2019, which is incorporated by reference herein in its entirety. The computing device may, in practice, use the foregoing process as the "pattern matching technique" referenced in the above-identified co-pending application. And in particular, when the computing device engages in the foregoing process and thereby concludes that a first two-dimensional drawing and a second two-dimensional drawing depict the same portion of a construction project, then the computing device may engage in the remainder of the process steps set forth in the above-identified co-pending application. Other uses of the foregoing process are possible in other contexts as well.

V. Conclusion

Example embodiments of the disclosed innovations have been described above. Those skilled in the art will understand, however, that changes and modifications may be made to the embodiments described without departing from the true scope and spirit of the present invention, which will be defined by the claims.

For instance, those in the art will understand that the disclosed operations for engaging in a pattern matching technique to determine whether two (or more) two-dimensional technical drawings depict the same portion of a construction project may be implemented in other construction-related areas. The disclosed operations could be used in other contexts as well.

Further, to the extent that examples described herein involve operations performed or initiated by actors, such as "humans," "operators," "users" or other entities, this is for purposes of example and explanation only. The claims should not be construed as requiring action by such actors unless explicitly recited in the claim language.

The invention claimed is:

1. A computing platform comprising:

at least one processor;

at least one non-transitory computer-readable medium; and program instructions stored on the at least one non-transitory computer-readable medium that are executable by the at least one processor such that the computing platform is configured to:

obtain a first collection of data libraries associated with a first set of intersection points among a first set of lines in a first two-dimensional (2D) drawing, wherein the first set of intersection points are located at outermost edges of the first 2D drawing;

obtain a second collection of data libraries associated with a second set of intersection points among a second set of lines in a second 2D drawing, wherein the second set of intersection points are located at outermost edges of the second 2D drawing; and perform a comparison of (i) at least a portion of the first collection of data libraries associated with the first 2D drawing and (ii) at least a portion of the second collection of data libraries associated with the second 2D drawing in order to determine whether the first 2D drawing and the second 2D drawing represent a same portion of a real-world environment;

wherein each data library associated with a given set of intersection points includes location information that describes a respective location of each respective intersection point in the given set of intersection points relative to each other intersection point in the given set of intersection points.

2. The computing platform of claim 1, further comprising program instructions that are executable by the at least one processor such that the computing platform is configured to:

based on the comparison, determine that the first 2D drawing and the second 2D drawing represent the same portion of a real-world environment.

3. The computing platform of claim 1, wherein the first set of lines are each aligned within a threshold extent of either an x-axis or a y-axis of the first 2D drawing.

4. The computing platform of claim 3, wherein the threshold extent comprises an angle of five degrees from either the x-axis or the y-axis of the first 2D drawing.

5. The computing platform of claim 3, further comprising program instructions that are executable by the at least one processor such that the computing platform is configured to:

identify (i) the first set of lines in the first 2D drawing that are aligned within the threshold extent of either the x-axis or the y-axis of the first 2D drawing and (ii) a second set of lines in the first 2D drawing that are not aligned within the threshold extent of either the x-axis or the y-axis of the first 2D drawing;

refrain from analyzing the second set of lines such that all remaining lines in the first 2D drawing that are to be analyzed comprise the first set of lines in the first 2D drawing; and identify intersection points among two or more lines of the remaining lines, wherein the first set of intersection points comprises at least a subset of the identified intersection points among the two or more lines of the remaining lines.

6. The computing platform of claim 5, further comprising program instructions that are executable by the at least one processor such that the computing platform is configured to:

cause a computing device to display, via a user interface of the computing device, a representation of the first 2D drawing, wherein the second set of lines are omitted from the representation of the first 2D drawing.

7. The computing platform of claim 3, further comprising program instructions that are executable by the at least one processor such that the computing platform is configured to:

identify the first set of lines that are aligned within the threshold extent of either the x-axis or the y-axis by:

determining that less than a threshold number of lines in the first 2D drawing are aligned within the threshold extent of either the x-axis or the y-axis of the first 2D drawing;

rotating the first 2D drawing until at least the threshold number of lines in the first 2D drawing are aligned within the threshold extent of either the x-axis or the y-axis of the first 2D drawing; and identifying, as the first set of lines, the lines that are aligned within the threshold extent of either the x-axis or the y-axis of the first 2D drawing after rotating the first 2D drawing.

8. The computing platform of claim 7, wherein rotating the first 2D drawing until at least the threshold number of lines in the first 2D drawing are aligned within the threshold extent of either the x-axis or the y-axis of the first 2D drawing comprises:

rotating the first 2D drawing from an initial position in a clockwise direction until at least the threshold number of lines are aligned within the threshold extent;

rotating the first 2D drawing from the initial position in a counter-clockwise direction until at least the threshold number of lines are aligned within the threshold extent;

determining which one of (a) the clockwise-direction rotation or (b) the counter-clockwise-direction rotation was rotated to a lesser extent until at least the threshold number of lines were aligned within the threshold extent; and using the determined one of (a) the clockwise-direction rotation or (b) the counter-clockwise-direction rotation of the first 2D drawing to determine the first set of intersection points.

9. The computing platform of claim 1, further comprising program instructions that are executable by the at least one processor such that the computing platform is configured to:

determine the first set of intersection points by:

identifying each intersection point among the first set of lines;

for each intersection point among the first set of lines, determining a respective x-y coordinate;

from x-y coordinates determined for the intersection points among the first set of lines, determining a maximum x-coordinate, a minimum x-coordinate, a maximum y-coordinate, and a minimum y-coordinate; and identifying, as the first set of intersection points, any intersection point having a respective x-y coordinate comprising at least one of the maximum x-coordinate, the minimum x-coordinate, the maximum y-coordinate, or the minimum y-coordinate.

10. The computing platform of claim 1, further comprising program instructions that are executable by the at least one processor such that the computing platform is configured to:

determine the first set of intersection points by:

identifying each intersection point among the first set of lines;

for each intersection point among the first set of lines:

generating a respective Cartesian plane with an origin located at the intersection point, the intersection point's respective Cartesian plane being divided into four quadrants; and for each respective quadrant in the intersection point's respective Cartesian plane, determining whether the respective quadrant contains any other intersection point; and identifying, as the first set of intersection points, any intersection point having at least one respective Cartesian plane quadrant that contains no other intersection point.

11. The computing platform of claim 1, wherein the location information included in each given set of intersection points comprises one or both of (i) an orientation of each other intersection point in the given set relative to the respective intersection point or (ii) a distance of each other intersection point in the given set relative to the respective intersection point.

12. The computing platform of claim 1, wherein:

the program instructions that are executable by the at least one processor such that the computing platform is configured to perform the comparison comprise program instructions that are executable by the at least one processor such that the computing platform is configured to:

make a first comparison between (i) the portion of the first collection of data libraries for the first 2D drawing and (ii) the portion of the second collection of data libraries for the second 2D drawing and thereby determine a scale factor; and apply the determined scale factor to the location information included in the first collection of data libraries for the first 2D drawing and thereby generate a scale-factor-adjusted first collection of data libraries for the first 2D drawing; and the computing platform further comprises program instructions that are executable by the at least one processor such that the computing platform is configured to:

make a second comparison between (i) the scale-factor-adjusted first collection of data libraries for the first 2D drawing and (ii) the second collection of data libraries for the second 2D drawing; and based on the second comparison, determine that the first 2D drawing and the second 2D drawing represent the same portion of the real-world environment.

13. The computing platform of claim 1, wherein:

the program instructions that are executable by the at least one processor such that the computing platform is configured to perform the comparison comprise program instructions that are executable by the at least one processor such that the computing platform is configured to:

make a first comparison between (i) a first selected data library for the first 2D drawing and (ii) a second selected data library for the second 2D drawing; and the computing platform further comprises program instructions that are executable by the at least one processor such that the computing platform is configured to:

make a first determination that either (i) respective location information included in the first and second data libraries differ by no more than a threshold extent or (ii) a threshold number of values of the respective location information included in the first and second data libraries match; and based on the first determination, make a second determination that the first 2D drawing and the second 2D drawing represent the same portion of the real-world environment.

14. The computing platform of claim 1, further comprising program instructions that are executable by the at least one processor such that the computing platform is configured to:

receive, from a computing device, an indication of user input requesting retrieval of the first 2D drawing; and based on the indication, retrieve the first 2D drawing.

15. A non-transitory computer-readable medium, wherein the non-transitory computer-readable medium is provisioned with program instructions that, when executed by at least one processor, cause a computing platform to:

obtain a first collection of data libraries associated with a first set of intersection points among a first set of lines in a first two-dimensional (2D) drawing, wherein the first set of intersection points are located at outermost edges of the first 2D drawing;

obtain a second collection of data libraries associated with a second set of intersection points among a second set of lines in a second 2D drawing, wherein the second set of intersection points are located at outermost edges of the second 2D drawing; and perform a comparison of (i) at least a portion of the first collection of data libraries associated with the first 2D drawing and (ii) at least a portion of the second collection of data libraries associated with the second 2D drawing in order to determine whether the first 2D drawing and the second 2D drawing represent a same portion of a real-world environment;

wherein each data library associated with a given set of intersection points includes location information that describes a respective location of each respective intersection point in the given set of intersection points relative to each other intersection point in the given set of intersection points.

16. The non-transitory computer-readable medium of claim 15, wherein the non-transitory computer-readable medium is also provisioned with program instructions that, when executed by at least one processor, cause the computing platform to:

based on the comparison, determine that the first 2D drawing and the second 2D drawing represent the same portion of a real-world environment.

17. The non-transitory computer-readable medium of claim 15, wherein the first set of lines are each aligned within a threshold extent of either an x-axis or a y-axis of the first 2D drawing.

18. The non-transitory computer-readable medium of claim 17, wherein the non-transitory computer-readable medium is also provisioned with program instructions that, when executed by at least one processor, cause the computing platform to:

identify (i) the first set of lines in the first 2D drawing that are aligned within the threshold extent of either the x-axis or the y-axis of the first 2D drawing and (ii) a second set of lines in the first 2D drawing that are not aligned within the threshold extent of either the x-axis or the y-axis of the first 2D drawing;

refrain from analyzing the second set of lines such that all remaining lines in the first 2D drawing that are to be analyzed comprise the first set of lines in the first 2D drawing; and identify intersection points among two or more lines of the remaining lines, wherein the first set of intersection points comprises at least a subset of the identified intersection points among the two or more lines of the remaining lines.

19. A method carried out by a computing platform, the method comprising:

obtaining a first collection of data libraries associated with a first set of intersection points among a first set of lines in a first two-dimensional (2D) drawing, wherein the first set of intersection points are located at outermost edges of the first 2D drawing;

obtaining a second collection of data libraries associated with a second set of intersection points among a second set of lines in a second 2D drawing, wherein the second set of intersection points are located at outermost edges of the second 2D drawing; and performing a comparison of (i) at least a portion of the first collection of data libraries associated with the first 2D drawing and (ii) at least a portion of the second collection of data libraries associated with the second 2D drawing in order to determine whether the first 2D drawing and the second 2D drawing represent a same portion of a real-world environment;

wherein each data library associated with a given set of intersection points includes location information that describes a respective location of each respective intersection point in the given set of intersection points relative to each other intersection point in the given set of intersection points.

20. The method of claim 19, further comprising:

based on the comparison, determining that the first 2D drawing and the second 2D drawing represent the same portion of a real-world environment.

\* \* \* \* \*